US012771338B2

(12) United States Patent
Chen et al.

(10) Patent No.: US 12,771,338 B2
(45) Date of Patent: Oct. 20, 2026

(54) SIGNAL-SWITCHING CIRCUIT, SIGNAL-SWITCHING METHOD, AND USER EQUIPMENT

(71) Applicant: Harman International Industries, Incorporated, Stamford, CT (US)

(72) Inventors: Qingxiong Chen, Guangdong (CN); Yi Zhang, Guangdong (CN)

(73) Assignee: HARMAN INTERNATIONAL INDUSTRIES, INCORPORATED, Stamford, CT (US)

( * ) Notice: Subject to any disclaimer, the term of this patent is extended or adjusted under 35 U.S.C. 154(b) by 14 days.

(21) Appl. No.: 19/190,381

(22) Filed: Apr. 25, 2025

(65) Prior Publication Data

US 2025/0350275 A1 Nov. 13, 2025

(30) Foreign Application Priority Data

May 8, 2024 (CN) ......................... 202410561036.0

(51) Int. Cl.
*H03K 17/16* (2006.01)
*H03K 17/94* (2006.01)

(52) U.S. Cl.
CPC ........... *H03K 17/161* (2013.01); *H03K 17/94* (2013.01); *H03K 2217/94089* (2013.01)

(58) Field of Classification Search
None
See application file for complete search history.

(56) References Cited

U.S. PATENT DOCUMENTS 9,185,536 B1 * 11/2015 Johnson .................. H04W 4/16
2017/0249271 A1 8/2017 Gagne-Keats et al.

FOREIGN PATENT DOCUMENTS

CN 113672534 A 11/2021

OTHER PUBLICATIONS

European Patent Office, Extended European Search Report Issued in Application No. 25174835.6, Oct. 1, 2025, Germany, 11 pages.

* cited by examiner

*Primary Examiner* — Cassandra F Cox
(74) *Attorney, Agent, or Firm* — McCoy Russell LLP

(57) ABSTRACT

Embodiments of the present disclosure provide a signal-switching circuit, a signal-switching method, and a user equipment. The signal-switching circuit includes: a first electrical connector used for connecting with a second electrical connector, wherein the second electrical connector is used for providing a first group of signal terminals; a signal processing circuit used for providing a second group of signal terminals, wherein the first group of signal terminals is different from the second group of signal terminals, and the second electrical connector and the signal processing circuit are connected to different grounding points isolated from each other; a connection detection circuit used for detecting whether the first electrical connector is connected with the second electrical connector; and a control unit used for causing the signal processing circuit to stop transmitting signals with the second group of signal terminals in a case of detecting that the first electrical connector is connected with the second electrical connector; wherein the signal-switching circuit is configured to connect the first group of signal terminals or the second group of signal terminals to an electronic device. The signal-switching circuit of the present disclosure can realize signal switching at a low cost and prevent electromagnetic interference.

10 Claims, 8 Drawing Sheets

SIGNAL-SWITCHING CIRCUIT, SIGNAL-SWITCHING METHOD, AND USER EQUIPMENT

CROSS REFERENCE TO RELATED APPLICATIONS

The present application claims priority to Chinese Patent Application No. 2024105610360, entitled "SIGNAL-SWITCHING CIRCUIT, SIGNAL-SWITCHING METHOD, AND USER EQUIPMENT", and filed on May 8, 2024. The entire contents of the above-listed application are hereby incorporated by reference for all purposes.

TECHNICAL FIELD

The present disclosure relates to the field of electronics and circuits, and more specifically, to a signal-switching circuit, a signal-switching method, and a user equipment.

BACKGROUND

As the functions of electronic devices become more and more abundant, it has become a hot topic of current research as to how to switch the signals input to or output from the electronic devices conveniently and at low cost.

A signal-switching circuit is a circuit used for selecting and switching between different input signals. It usually consists of components such as switches, selectors, amplifiers, and filters, and can realize switching and selecting between multiple signal sources.

The function of the signal-switching circuit is to switch different input signals to the output so as to select the appropriate signal source in different application scenarios. Signal-switching circuits are widely applied in the fields of audio, video, communications, and instrumentation. It can help users switch between different signal sources conveniently and improve the flexibility and operability of the system. As an example, in an audio system, a signal-switching circuit can be used to switch different audio sources (e.g., a CD player, radio, MP3 player, etc.) to the speaker output. As another example, for a head-mounted device (e.g., a headset, a head-mounted virtual reality device), a signal-switching circuit can be used to switch the working mode of the head-mounted device so that it operates in a wired or wireless mode.

With the continuous development of science and technology, the application scenarios of signal-switching circuits are also expanding. In the future, with the rise of the Internet of Things, smart home, and other fields, signal-switching circuits will have a broader application space.

SUMMARY

In order to realize signal switching at low cost and prevent electromagnetic interference, the present disclosure provides a signal-switching circuit, including: a first electrical connector used for connecting with a second electrical connector, wherein the second electrical connector is used for providing a first group of signal terminals; a signal processing circuit used for providing a second group of signal terminals, wherein the first group of signal terminals is different from the second group of signal terminals, and the second electrical connector and the signal processing circuit are connected to different grounding points isolated from each other; a connection detection circuit used for detecting whether the first electrical connector is connected with the second electrical connector; and a control unit used for causing the signal processing circuit to stop transmitting signals with the second group of signal terminals in a case of detecting that the first electrical connector is connected with the second electrical connector; wherein the signal-switching circuit is configured to connect the first group of signal terminals to an electronic device in a case where the first electrical connector is connected with the second electrical connector; and connect the second group of signal terminals to the electronic device in a case where the first electrical connector is not connected with the second electrical connector.

According to an embodiment of the present disclosure, the electronic device operates in a first mode when the first electrical connector is connected with the second electrical connector, and operates in a second mode when the first electrical connector is not connected with the second electrical connector.

According to an embodiment of the present disclosure, the first mode is a wired working mode, and the second mode is a wireless working mode, and the wireless working mode includes at least one of a radio wave working mode, a Bluetooth working mode, and an infrared working mode.

According to an embodiment of the present disclosure, the electronic device includes at least two sub-devices; the control unit is further configured to output a switching enable signal in a case of detecting that the first electrical connector is connected with the second electrical connector; where the signal-switching circuit further includes: a switching circuit configured to connect some of the first group of the signal terminals to at least some of the at least two sub-devices, in response to the switching enable signal received from the control unit.

According to an embodiment of the present disclosure, the first group of signal terminals includes a first group of positive signal terminals and a first group of negative signal terminals, the second group of signal terminals includes a second group of positive signal terminals and a second group of negative signal terminals; where the first electrical connector is used for switching the positive signal terminals of the at least two sub-devices to the first group of positive signal terminals or the second group of positive signal terminals, and the switching circuit is used for switching the negative signal terminals of at least some of the at least two sub-devices to the first group of negative signal terminals or the second group of negative signal terminals; or the first electrical connector is used for switching the negative signal terminals of the at least two sub-devices to the first group of negative signal terminals or the second group of negative signal terminals, and the switching circuit is used for switching the positive signal terminals of at least some of the at least two sub-devices to the first group of positive signal terminals or the second group of positive signal terminals.

According to an embodiment of the present disclosure, in the case where the first electrical connector is used for switching the positive signal terminals of the at least two sub-devices to the first group of positive signal terminals or the second group of positive signal terminals, and the switching circuit is used for switching the negative signal terminals of at least some of the at least two sub-devices to the first group of negative signal terminals or the second group of negative signal terminals, connecting the first group of signal terminals to an electronic device includes: connecting the first group of positive signal terminals to the positive signal terminals of the at least two sub-devices respectively by using the contacts of the first electrical connector; and connecting the first group of negative signal terminals to the negative signal terminals of the at least two sub-devices respectively by using the switching circuit; or connecting the first negative signal terminal in the first group of negative signal terminals to the negative signal terminal of the first sub-device in the at least two sub-devices by using the contacts of the first electrical connector, and connecting other negative signal terminals than the first negative signal terminal in the first group of negative signal terminals to the negative signal terminals of other sub-devices than the first sub-device among the at least two sub-devices respectively by using the switching circuit; connecting the second group of signal terminals to an electronic device includes: connecting the second group of positive signal terminals to the positive signal terminals of the at least two sub-devices respectively by using the contacts of the first electrical connector; and directly connecting the second group of negative signal terminals to the negative signal terminals of the at least two sub-devices respectively, or connecting the second group of negative signal terminals to the negative signal terminals of the at least two sub-devices respectively by using the switching circuit.

According to an embodiment of the present disclosure, the switching circuit includes transistors, where the switching circuit turns on the transistors based on the switching enable signal to connect the first group of negative signal terminals to the negative signal terminals of the at least two sub-devices respectively, or connect other negative signal terminals than the first negative signal terminal in the first group of negative signal terminals to the negative signal terminals of other sub-devices than the first sub-device among the at least two sub-devices respectively.

An embodiment of the present disclosure further provides a signal-switching method, including: in a case of detecting that a first electrical connector is connected with a second electrical connector, connecting a first group of signal terminals to an electronic device and causing a signal processing circuit to stop transmitting signals with a second group of signal terminals, where the second electrical connector is used for providing the first group of signal terminals, and the signal processing circuit is used for providing the second group of signal terminals; and in a case of detecting that the first electrical connector is not connected with the second electrical connector, connecting the second group of signal terminals to the electronic device, where the first group of signal terminals are different from the second group of signal terminals, and the second electrical connector and the signal processing circuit are connected to different grounding points isolated from each other.

An embodiment of the present disclosure further provides a user equipment including a signal-switching circuit and an electronic device, where the signal-switching circuit includes: a first electrical connector used for connecting with a second electrical connector, where the second electrical connector is used for providing a first group of signal terminals; a signal processing circuit used for providing a second group of signal terminals, where the first group of signal terminals is different from the second group of signal terminals, and the second electrical connector and the signal processing circuit are connected to different grounding points isolated from each other; a connection detection circuit used for detecting whether the first electrical connector is connected with the second electrical connector; and a control unit used for causing the signal processing circuit to stop transmitting signals with the second group of signal terminals in a case of detecting that the first electrical connector is connected with the second electrical connector; where the signal-switching circuit is configured to: connect the first group of signal terminals to the electronic device in a case where the first electrical connector is connected with the second electrical connector; and connect the second group of signal terminals to the electronic device in a case where the first electrical connector is not connected with the second electrical connector.

The signal-switching circuit of the present disclosure can switch signals input to or output from electronic devices conveniently and at low cost. Since the signal terminals corresponding to different signals in the signal-switching circuit of the present disclosure correspond to different grounding points, the electromagnetic interference to electronic devices when working based on different signals can be effectively reduced.

DESCRIPTION OF THE DRAWINGS

In order to more clearly illustrate the technical solutions of the embodiments of the present disclosure, the drawings required for describing the embodiments are briefly introduced below. Apparently, the drawings in the following description show only some exemplary embodiments of the present disclosure, and for those of ordinary skills in the art, other drawings can also be obtained based on these drawings without making creative effort.

Here, in the drawings.

DETAILED DESCRIPTION

Figure 1A:
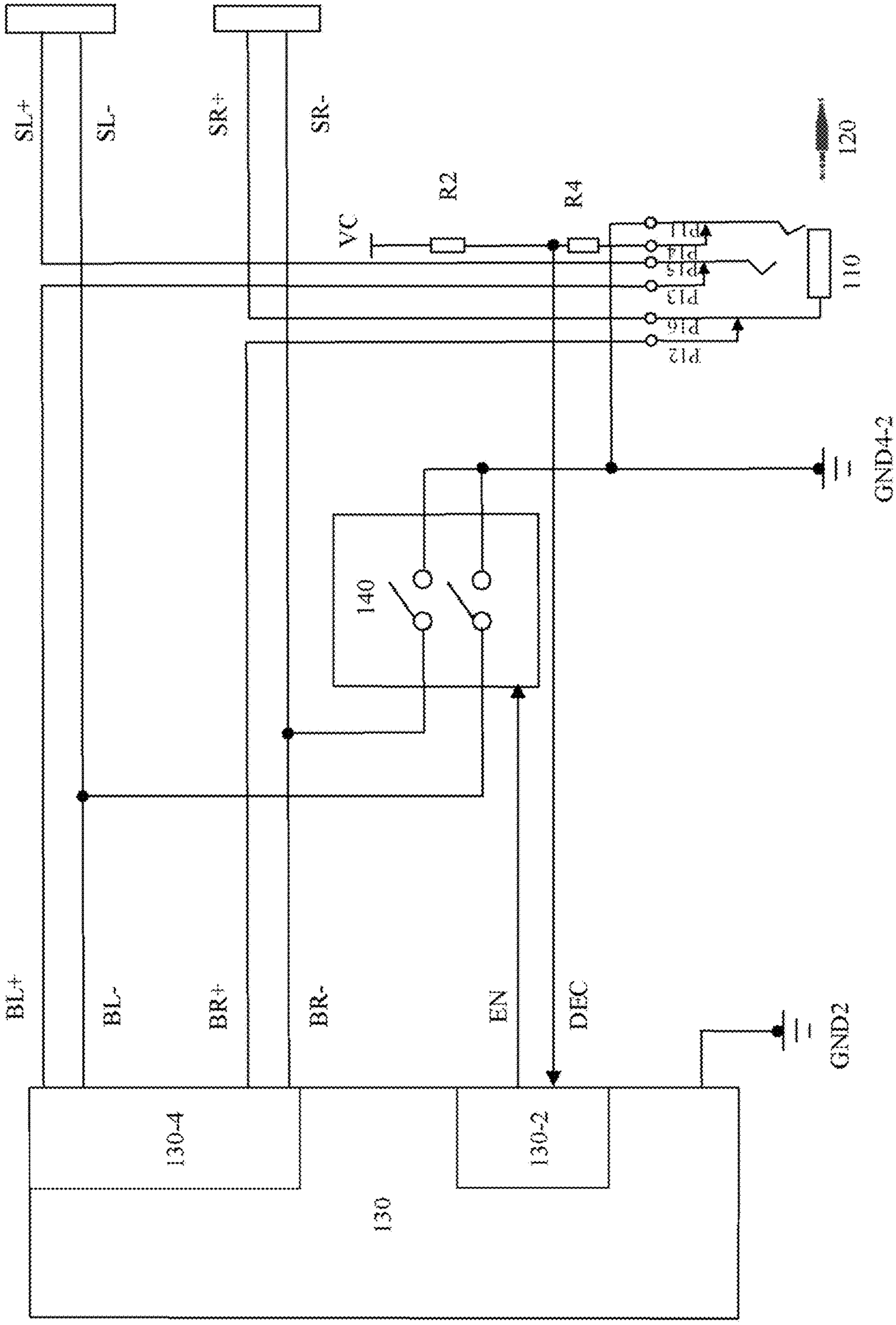
FIG. 1A illustrates a schematic principle diagram of a signal-switching circuit according to a first embodiment of the present disclosure.

In order to make the objectives, technical solutions, and advantages of the present disclosure more obvious, exemplary embodiments according to the present disclosure will be described in detail below with reference to the drawings. Apparently, the described embodiments are only some of the embodiments of the present disclosure, rather than all the embodiments of the present disclosure. It should be understood that the present disclosure is not limited by the exemplary embodiments described herein.

Furthermore, in this specification and the drawings, substantially the same or similar steps and elements are denoted by the same or similar reference numerals, and duplicated description of these steps and elements will be omitted.

Furthermore, in this specification and the drawings, elements are described in the singular or in the plural according to the embodiment. However, the singular and plural forms are appropriately selected for the presented cases merely for convenience of explanation and are not intended to limit the present disclosure thereto. Therefore, a singular form may include a plural form and a plural form may also include a singular form, unless expressively stated otherwise in the context.

In addition, in this specification and the drawings, the terms "first/second" involved are merely used to distinguish similar objects and do not represent a specific ordering of the objects. It is understandable that "first/second" can be interchanged with a specific order or sequence where permitted, so that the embodiments of the present disclosure described herein can be implemented in an order other than that illustrated or described herein.

In addition, in this specification and the drawings, the terms "upper", "lower", "vertical", "horizontal", etc., which refer to orientation or positional relationships, are used only to facilitate the description of the embodiments according to the present disclosure and are not intended to limit the present disclosure thereto. Therefore, they should not be construed as limitation of the present disclosure.

Furthermore, in this specification and the drawings, unless expressly stated otherwise, "connection" does not necessarily mean "direct connection" or "direct contact"; here, "connection" may refer to both a fixation function and electrical communication.

As an example, the present disclosure relates to the fields of electronics and circuits, and the embodiments of the present disclosure will be further described below in conjunction with the drawings.

FIG. 1A illustrates a schematic principle diagram of a signal-switching circuit according to a first embodiment of the present disclosure.

As shown in FIG. 1A, the control circuit 130 includes a control unit 130-2 and a signal processing circuit 130-4. In a case where a second electrical connector 120 is not connected with a first electrical connector 110, a contact P12 and a contact P16 of the first electrical connector 110 are connected, a contact P13 and a contact P15 thereof are connected, and a contact P14 and a contact P11 thereof are connected. One end of a resistor R2 is input with a positive voltage signal VC (e.g., the positive voltage signal VC may be 1.8 V), and the other end of the resistor R2 is connected with a resistor R4, which is connected to a grounding point GND4-2 through the connected contacts P14 and P11. The resistance value of R2 may be greater than that of R4 (e.g., the resistance value of R2 may be 1 MΩ, and the resistance value of R4 may be 1 kΩ).

Therefore, in a case where the second electrical connector 120 is not connected with the first electrical connector 110, a low-level detection signal DEC can be output, and the control unit 130-2 can determine that the switching enable signal EN is at a high level (here, enabling when the switching enable signal EN is at a low level is used as an example, not a limitation) based on the low-level detection signal DEC, so that the switching circuit 140 disconnects lines at both ends thereof. It should be noted that the switching circuit 140 in FIG. 1A is shown only by a schematic principle diagram, and in fact the switching circuit 140 may include a plurality of electronic devices. Optionally, the switching circuit 140 may be implemented based on an integrated circuit (IC), or the switching circuit 140 may be implemented based on transistors.

Therefore, a positive signal terminal BL+ of the signal processing circuit 130-4 can be connected with a positive signal terminal SL+ of a first electronic device U2, a positive signal terminal BR+ of the signal processing circuit 130-4 can be connected with a positive signal terminal SR+ of a second electronic device U4, a negative signal terminal BL− of the signal processing circuit 130-4 can be connected with a negative signal terminal SL− of the first electronic device U2 and connected to a grounding point GND2 of the signal processing circuit 130, and a negative signal terminal BR− of the signal processing circuit 130-4 can be connected with a negative signal terminal SR− of the second electronic device U4 and connected to the grounding point GND2.

That is, at this time, the first electronic device U2 and the second electronic device U4 both transmit signals with the signal processing circuit 130-4. The signal processing circuit 130-4 provides a group of signal terminals through the contact P12, the contact P16, the contact P13, the contact P15, and the contact P14.

In a case where the second electrical connector 120 is connected with the first electrical connector 110, the contact P12 and the contact P16 of the first electrical connector 110 are disconnected, the contact P13 and the contact P15 thereof are disconnected, and the contact P14 and the contact P11 thereof are disconnected. The disconnection process can be automatically implemented based on a circuit or a mechanical structure.

Therefore, in a case where the second electrical connector 120 is connected with the first electrical connector 110, a high-level detection signal DEC can be output, and the control unit 130-2 can determine that the switching enable signal EN is at a low level (here, enabling when the switching enable signal EN is at a low level is taken as an example, but not a limitation) based on the high-level detection signal DEC, so that the switching circuit 140 connects lines at both ends thereof.

Therefore, a positive signal terminal SL+ of the first electronic device U2 can transmit signals with a circuit (not shown) connected to the second electrical connector 120 through the contact P15, a positive signal terminal SR+ of the second electronic device U4 can transmit signals with the circuit connected to the second electrical connector 120 through the contact P16, a negative signal terminal SL− of the first electronic device U2 can be connected with a grounding point GND4-2 through the contact P11, and a negative signal terminal SR− of the second electronic device U4 can be connected with the grounding point GND4-2 through the contact P11.

That is, at this time, both the first electronic device U2 and the second electronic device U4 transmit signals with the circuit connected to the second electrical connector 120. The second electrical connector 120 provides a group of signal terminals through the contact P11, the contact P15, and the contact P16, and this group of signal terminals is different from the group of signal terminals provided by the signal processing circuit 130-4.

For the embodiment above, GND2 and the grounding point GND4-2 may be the same grounding point (i.e., both are grounding points of the signal processing circuit 130).

Figure 1B:
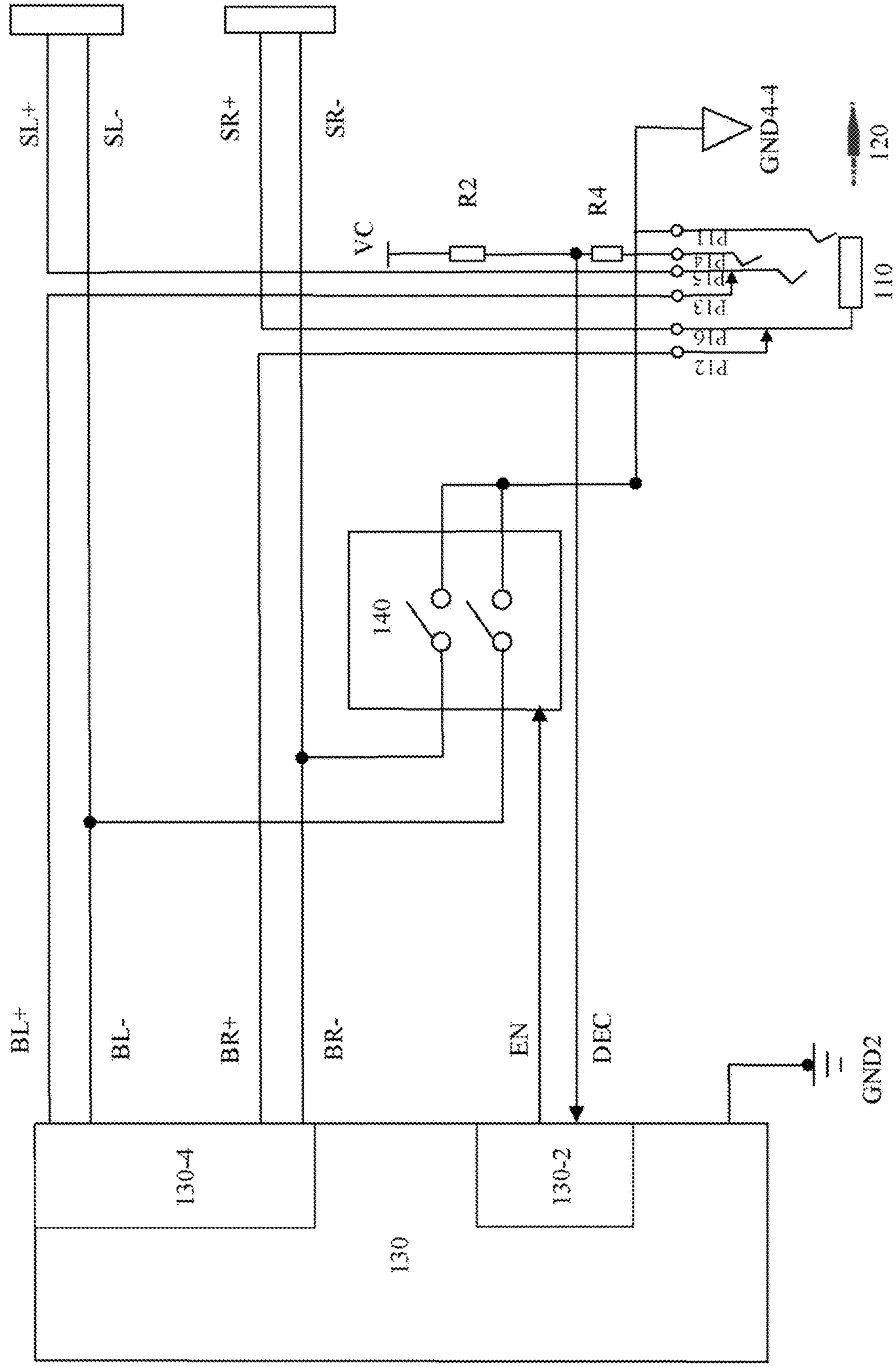
FIG. 1B illustrates a schematic principle diagram of a signal-switching circuit according to a second embodiment of the present disclosure.

Similar to the embodiment shown in FIG. 1A, FIG. 1B illustrates a schematic principle diagram of a signal-switching circuit according to a second embodiment of the present disclosure. In a case where the first electrical connector 110 and the second electrical connector 120 are not connected, the contact P12 and the contact P16 of the first electrical connector 110 can be connected, the contact P13 and the contact P15 thereof can be connected, the contact P14 and the contact P11 thereof can be disconnected, and a high-level detection signal DEC can be output. The control unit 130-2 can determine that the switching enable signal EN is at a high level (here, enabling when the switching enable signal EN is at a low level is taken as an example, but not a limitation) based on the high-level detection signal DEC, so that the switching circuit 140 disconnects lines at both ends thereof. In a case where the first electrical connector 110 and the second electrical connector 120 are connected, the contact P12 and the contact P16 of the first electrical connector 110 can be disconnected, the contact P13 and the contact P15 thereof can be disconnected, the contact P14 and the contact P11 thereof can be connected, and a low-level detection signal DEC can be output. The control unit 130-2 can determine that the switching enable signal EN is at a low level (here, enabling when the switching enable signal EN is at a low level is taken as an example, but not a limitation) based on the low-level detection signal DEC, so that the switching circuit 140 connects lines at both ends thereof.

At this time, the contact P11 can be connected to the grounding point GND4-4 through the second electrical connector 120. The grounding point GND2 and the grounding point GND4-4 may be different grounding points isolated from each other to reduce electromagnetic interference (i.e., GND2 is the grounding point of the signal processing circuit 130, and GND4-4 is the grounding point of the circuit connected to the second electrical connector 120).

It should be understood that the contacts of the first electrical connector 110 and the connection modes thereof shown in FIGS. 1A and 1B are merely illustrative examples. Based on similar principles, the contacts of the first electrical connector 110 may also be implemented in other ways.

The first electronic device U2 and the second electronic device U4 in FIGS. 1A and 1B can be either a signal sending device (e.g., sending signals to the signal processing circuit 130-4, or a circuit connected to the second electrical connector 120) or a signal receiving device (e.g., receiving signals from the signal processing circuit 130-4, or a circuit connected to the second electrical connector 120).

For example, in a case where the first electronic device U2 and the second electronic device U4 are both signal receiving devices, the first electronic device U2 and the second electronic device U4 may be a left earphone and a right earphone, respectively, and the control circuit 130 may be a Bluetooth chip. In a case where the second electrical connector 120 is not connected with the first electrical connector 110, an audio signal can be provided to the left earphone and the right earphone through the Bluetooth chip. In a case where the second electrical connector 120 is connected with the first electrical connector 110, an audio signal can be provided to the left earphone and the right earphone through the circuit connected to the second electrical connector 120.

As another example, in a case where the first electronic device U2 is a signal receiving device and the second electronic device U4 is a signal sending device, the first electronic device U2 may be an earphone, the second electronic device U4 may be a microphone, and the control circuit 130 may be a Bluetooth chip. In a case where the second electrical connector 120 is not connected with the first electrical connector 110, an audio signal can be provided to the earphone through the Bluetooth chip, and the audio signal input from the microphone can be transmitted to the Bluetooth chip; and in a case where the second electrical connector 120 is connected with the first electrical connector 110, an audio signal can be provided to the earphone through a circuit connected to the second electrical connector 120, and the audio signal input from the microphone can be transmitted to the Bluetooth chip.

It should be noted that the first electrical connector 110 and the second electrical connector 120 in the present disclosure may be electrical connectors of various models and specifications. For example, the first electrical connector 110 and the second electrical connector 120 may be implemented based on an auxiliary (AUX) interface, a universal serial bus (USB) interface, a universal serial bus C (Type-C) interface, an electrical connector interface, and the like. Optionally, the first electrical connector 110 may be a socket, and the second electrical connector 120 may be a plug; or alternatively, the first electrical connector 110 may be a plug, and the second electrical connector 120 may be a socket.

Figure 2A:
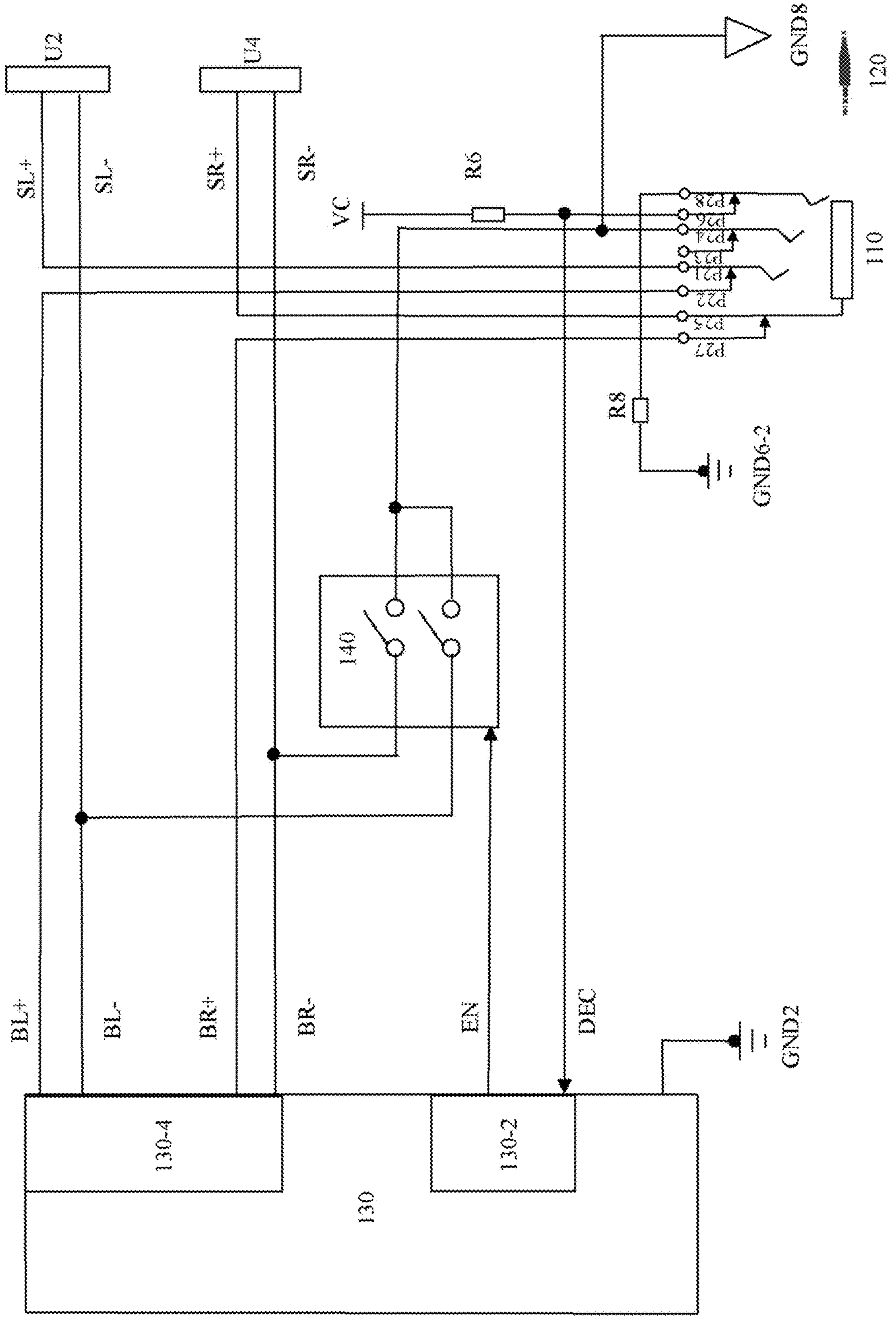
FIG. 2A illustrates a schematic principle diagram of a signal-switching circuit according to a third embodiment of the present disclosure.

FIG. 2A illustrates a schematic principle diagram of a signal-switching circuit according to a third embodiment of the present disclosure.

As shown in FIG. 2A, in a case where the second electrical connector 120 is not connected with the first electrical connector 110, the contact P27 and the contact P25 of the first electrical connector 110 are connected, the contact P22 and the contact P21 thereof are connected, the contact P23 and the contact P24 thereof are connected, and the contact P26 and the contact P28 thereof are connected. One end of a resistor R6 is input with a positive voltage signal VC (e.g., the positive voltage signal VC may be 1.8 V), and the other end of the resistor R6 is connected with a resistor R8, and the resistor R8 is connected to a grounding point GND6-2 through the connected contacts P26 and P28. The resistance value of R6 may be greater than that of R8 (e.g., the resistance value of R6 may be 1 MΩ, and the resistance value of R8 may be 10 kΩ).

Therefore, in a case where the second electrical connector 120 is not connected with the first electrical connector 110, a low-level detection signal DEC can be output, and the control unit 130-2 can determine that the switching enable signal EN is at a high level (here, enabling when the switching enable signal EN is at a low level is used as an example, not a limitation) based on the low-level detection signal DEC, so that the switching circuit 140 disconnects lines at both ends thereof. It should be noted that the switching circuit 140 in FIG. 2A is shown only by a schematic principle diagram, and in fact the switching circuit 140 may include a plurality of electronic devices. Optionally, the switching circuit 140 may be implemented based on an integrated circuit (IC), or the switching circuit 140 may be implemented based on transistors.

Therefore, a positive signal terminal BL+ of the signal processing circuit 130-4 can be connected with a positive signal terminal SL+ of a first electronic device U2, a positive signal terminal BR+ of the signal processing circuit 130-4 can be connected with a positive signal terminal SR+ of a second electronic device U4, a negative signal terminal BL− of the signal processing circuit 130-4 can be connected with a negative signal terminal SL− of the first electronic device U2 and connected to a grounding point GND2 of the signal processing circuit 130, and a negative signal terminal BR− of the signal processing circuit 130-4 can be connected with a negative signal terminal SR− of the second electronic device U4 and connected to the grounding point GND2.

That is, at this time, the first electronic device U2 and the second electronic device U4 both transmit signals with the signal processing circuit 130-4. The signal processing circuit 130-4 provides a group of signal terminals through the contact P27, the contact P25, the contact P22, the contact P21, and the contact P26.

In a case where the second electrical connector 120 is connected with the first electrical connector 110, the contact P27 and the contact P25 of the first electrical connector 110 are disconnected, the contact P22 and the contact P21 thereof are disconnected, the contact P23 and the contact P24 thereof are disconnected, and the contact P26 and the contact P28 thereof are disconnected. The disconnection process can be automatically implemented based on a circuit or a mechanical structure.

Therefore, in a case where the second electrical connector 120 is connected with the first electrical connector 110, a high-level detection signal DEC can be output, and the control unit 130-2 can determine that the switching enable signal EN is at a low level (here, enabling at a low level is taken as an example, but not a limitation) based on the high-level detection signal DEC, so that the switching circuit 140 connects lines at both ends thereof.

Therefore, a positive signal terminal SL+ of the first electronic device U2 can transmit signals with a circuit (not shown) connected to the second electrical connector 120 through the contact P21, a positive signal terminal SR+ of the second electronic device U4 can transmit signals with the circuit connected to the second electrical connector 120 through the contact P25, a negative signal terminal SL− of the first electronic device U2 can be connected with a grounding point GND8 through a signal terminal P2, and a negative signal terminal SR− of the second electronic device U4 can be connected with the grounding point GND8 through the contact P24.

That is, at this time, both the first electronic device U2 and the second electronic device U4 transmit signals with the circuit connected to the second electrical connector 120. The second electrical connector 120 provides a group of signal terminals through the contact P25, the contact P21, and the contact P24, and this group of signal terminals is different from the group of signal terminals provided by the signal processing circuit 130-4.

For the embodiment above, GND2 and the grounding point GND6-2 may be the same grounding point (i.e., both are grounding points of the signal processing circuit 130). To reduce electromagnetic interference, the grounding point GND2 and the grounding point GND8 in FIG. 2A may be different grounding points isolated from each other (i.e., GND2 is the grounding point of the signal processing circuit 130, and GND8 is the grounding point of the circuit connected to the second electrical connector 120).

Figure 2B:
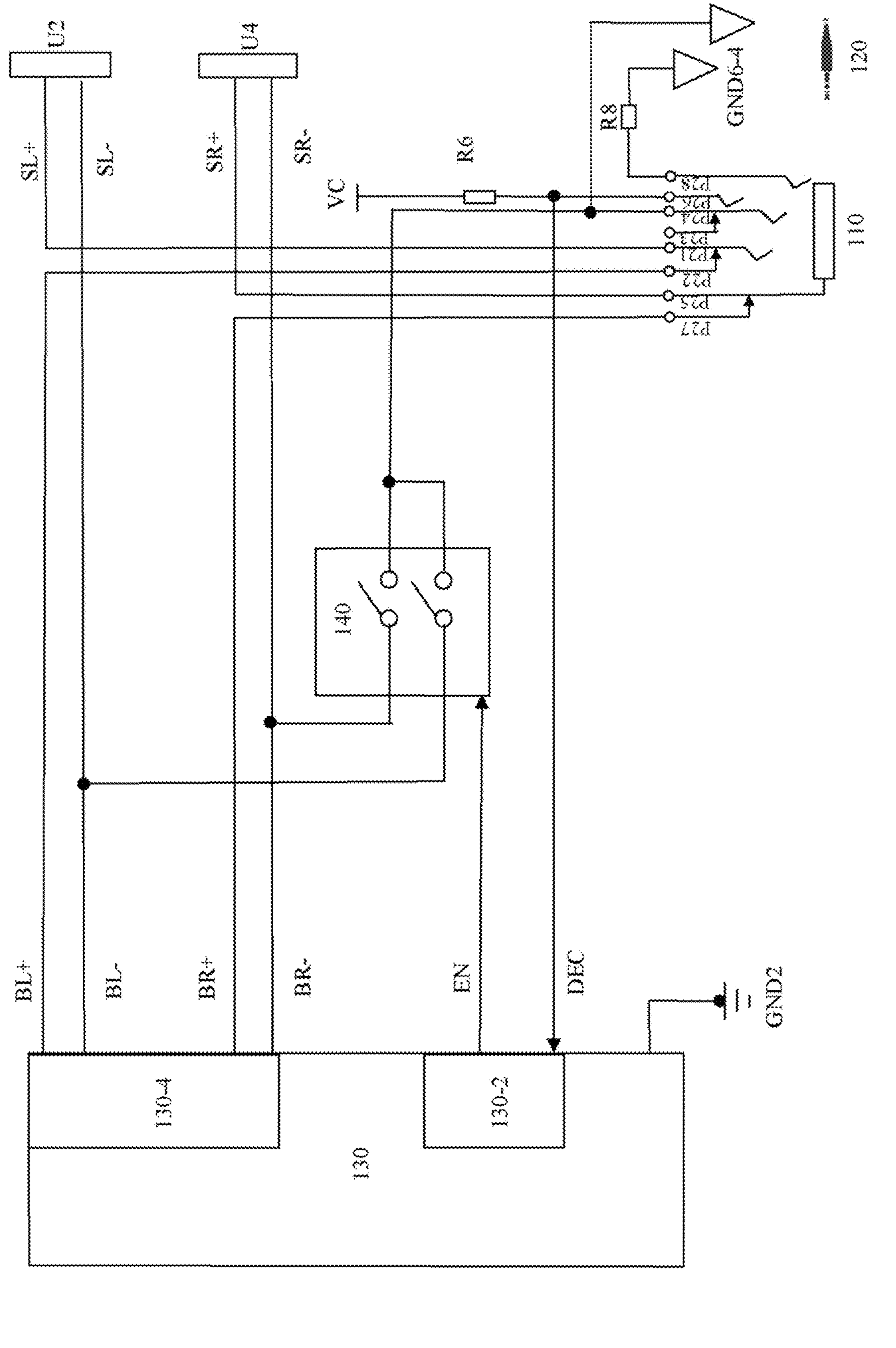
FIG. 2B illustrates a schematic principle diagram of a signal-switching circuit according to a fourth embodiment of the present disclosure.

Similar to the embodiment shown in FIG. 2A, FIG. 2B illustrates a schematic principle diagram of a signal-switching circuit according to a fourth embodiment of the present disclosure. In a case where the first electrical connector 110 and the second electrical connector 120 are not connected, the contact P27 and the contact P25 of the first electrical connector 110 can be connected, the contact P22 and the contact P21 thereof can be connected, the contact P23 and the contact P24 thereof can be connected, the contact P26 and the contact P28 thereof can be disconnected, and a high-level detection signal DEC can be output. The control unit 130-2 can determine that the switching enable signal EN is at a high level (here, enabling when the switching enable signal EN is at a low level is taken as an example, but not a limitation) based on the high-level detection signal DEC, so that the switching circuit 140 disconnects lines at both ends thereof. In a case where the first electrical connector 110 and the second electrical connector 120 are connected, the contact P27 and the contact P25 of the first electrical connector 110 can be disconnected, the contact P22 and the contact P21 thereof can be disconnected, the contact P23 and the contact P24 thereof can be disconnected, the contact P26 and the contact P28 thereof can be connected, and a low-level detection signal DEC can be output. The control unit 130-2 can determine that the switching enable signal EN is at a low level (here, enabling when the switching enable signal EN is at a low level is taken as an example, but not a limitation) based on the low-level detection signal DEC, so that the switching circuit 140 connects lines at both ends thereof.

At this time, the contact P26 can be connected to a grounding point GND6-4 through the second electrical connector 120. The grounding point GND2 and the grounding point GND6-4 may be different grounding points isolated from each other (i.e., GND2 is the grounding point of the signal processing circuit 130, and GND6-4 is the grounding point of the circuit connected to the second electrical connector 120).

It should be understood that the contacts of the first electrical connector 110 and the connection modes thereof shown in FIGS. 2A and 2B are merely illustrative examples. Based on similar principles, the contacts of the first electrical connector 110 may also be implemented in other ways. The first electronic device U2 and the second electronic device U4 in FIGS. 2A and 2B may be either a signal sending device or a signal receiving device.

Figure 3A:
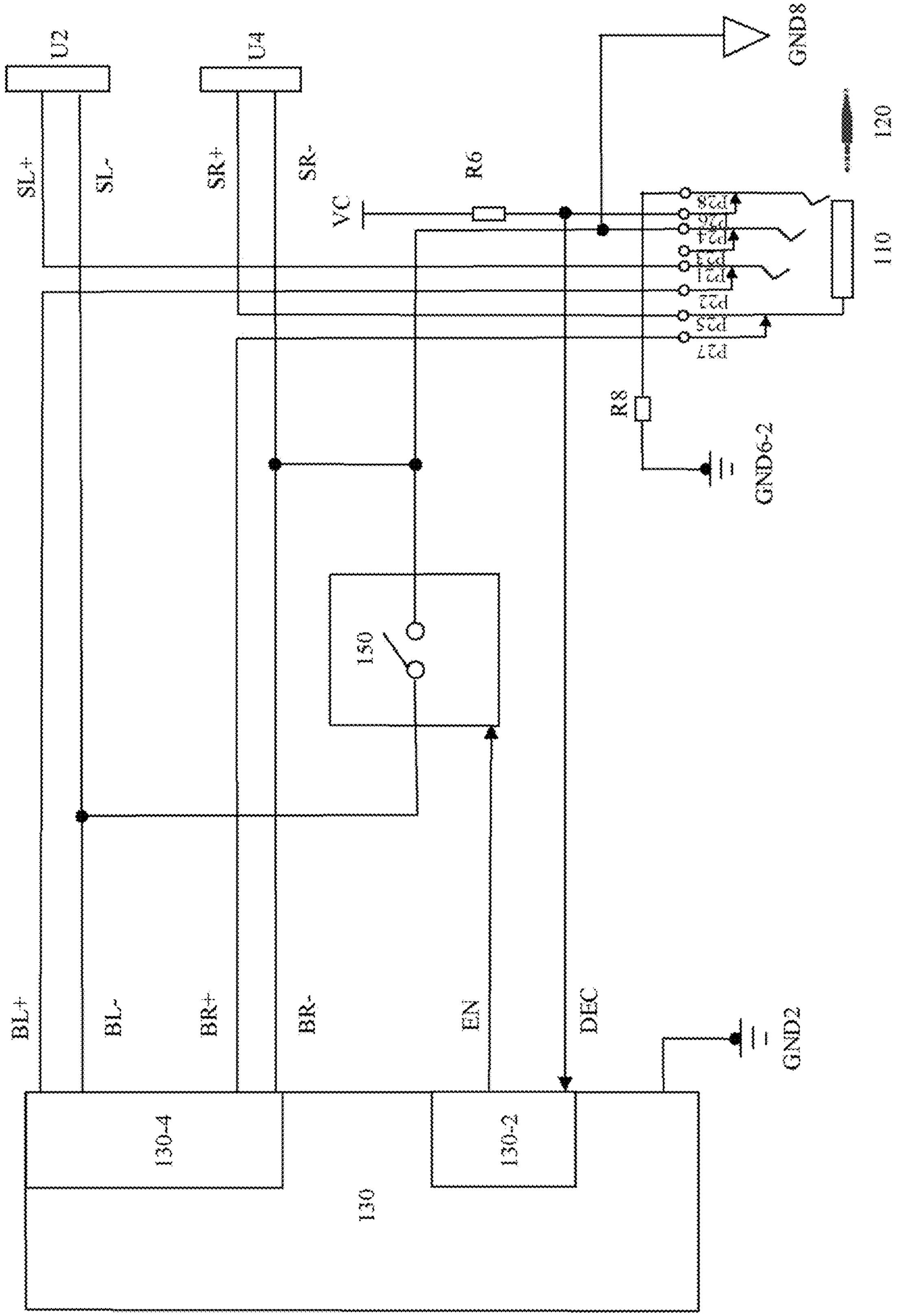
FIG. 3A illustrates a schematic principle diagram of a signal-switching circuit according to a fifth embodiment of the present disclosure.

FIG. 3A illustrates a schematic principle diagram of a signal-switching circuit according to a fifth embodiment of the present disclosure.

As shown in FIG. 3A, in a case where the second electrical connector 120 is not connected with the first electrical connector 110, the contact P27 and the contact P25 of the first electrical connector 110 are connected, the contact P22 and the contact P21 thereof are connected, the contact P23 and the contact P24 thereof are connected, and the contact P26 and the contact P28 thereof are connected. One end of a resistor R6 is input with a positive voltage signal VC (e.g., the positive voltage signal VC may be 1.8 V), and the other end of the resistor R6 is connected with a resistor R8, and the resistor R8 is connected to a grounding point GND6-2 through the connected contacts P26 and P28. The resistance value of R6 may be greater than that of R8 (e.g., the resistance value of R6 may be 1 MΩ, and the resistance value of R8 may be 10 kΩ).

Therefore, in a case where the second electrical connector 120 is not connected with the first electrical connector 110, a low-level detection signal DEC can be output, and the control unit 130-2 can determine that the switching enable signal EN is at a high level (here, enabling when the switching enable signal EN is at a low level is used as an example, not a limitation) based on the low-level detection signal DEC, so that the switching circuit 150 disconnects lines at both ends thereof. It should be noted that the switching circuit 150 in FIG. 3A is shown only by a schematic principle diagram, and in fact the switching circuit 150 may include a plurality of electronic devices. Optionally, the switching circuit 150 may be implemented based on an integrated circuit (IC), or the switching circuit 150 may be implemented based on transistors.

Therefore, a positive signal terminal BL+ of the signal processing circuit 130-4 can be connected with a positive signal terminal SL+ of the first electronic device U2, a positive signal terminal BR+ of the signal processing circuit 130-4 can be connected with a positive signal terminal SR+ of the second electronic device U4, a negative signal terminal BL− of the signal processing circuit 130-4 can be connected with a negative signal terminal SL− of the first electronic device U2 and connected to a grounding point GND2 of the signal processing circuit 130, and a negative signal terminal BR− of the signal processing circuit 130-4 can be connected with a negative signal terminal SR− of the second electronic device U4 and connected to the grounding point GND2.

That is, at this time, the first electronic device U2 and the second electronic device U4 both transmit signals with the signal processing circuit 130-4. The signal processing circuit 130-4 provides a group of signal terminals through the contact P27, the contact P25, the contact P22, the contact P21, and the contact P26.

In a case where the second electrical connector 120 is connected with the first electrical connector 110, the contact P27 and the contact P25 of the first electrical connector 110 are disconnected, the contact P22 and the contact P21 thereof are disconnected, the contact P23 and the contact P24 thereof are disconnected, and the contact P26 and the contact P28 thereof are disconnected. The disconnection process can be automatically implemented based on a circuit or a mechanical structure.

Therefore, in a case where the second electrical connector 120 is connected with the first electrical connector 110, a high-level detection signal DEC can be output, and the control unit 130-2 can determine that the switching enable signal EN is at a low level (here, enabling at a low level is taken as an example, but not a limitation) based on the high-level detection signal DEC, so that the switching circuit 150 connects lines at both ends thereof.

Therefore, a positive signal terminal SL+ of the first electronic device U2 can transmit signals with a circuit (not shown) connected to the second electrical connector 120 through the contact P21, a positive signal terminal SR+ of the second electronic device U4 can transmit signals with the circuit connected to the second electrical connector 120 through the contact P25, a negative signal terminal SL− of the first electronic device U2 can be connected with a grounding point GND8 through the signal terminal P2, and a negative signal terminal SR− of the second electronic device U4 can be connected with the grounding point GND8 through the contact P24.

That is, at this time, both the first electronic device U2 and the second electronic device U4 transmit signals with the circuit connected to the second electrical connector 120. The second electrical connector 120 provides a group of signal terminals through the contact P25, the contact P21, and the contact P24, and this group of signal terminals is different from the group of signal terminals provided by the signal processing circuit 130-4.

For the embodiment above, GND2 and the grounding point GND6-2 may be the same grounding point (i.e., both are grounding points of the signal processing circuit 130). To reduce electromagnetic interference, the grounding point GND2 and the grounding point GND8 in FIG. 3A may be different grounding points isolated from each other (i.e., GND2 is the grounding point of the signal processing circuit 130, and GND8 is the grounding point of the circuit connected to the second electrical connector 120).

Figure 3B:
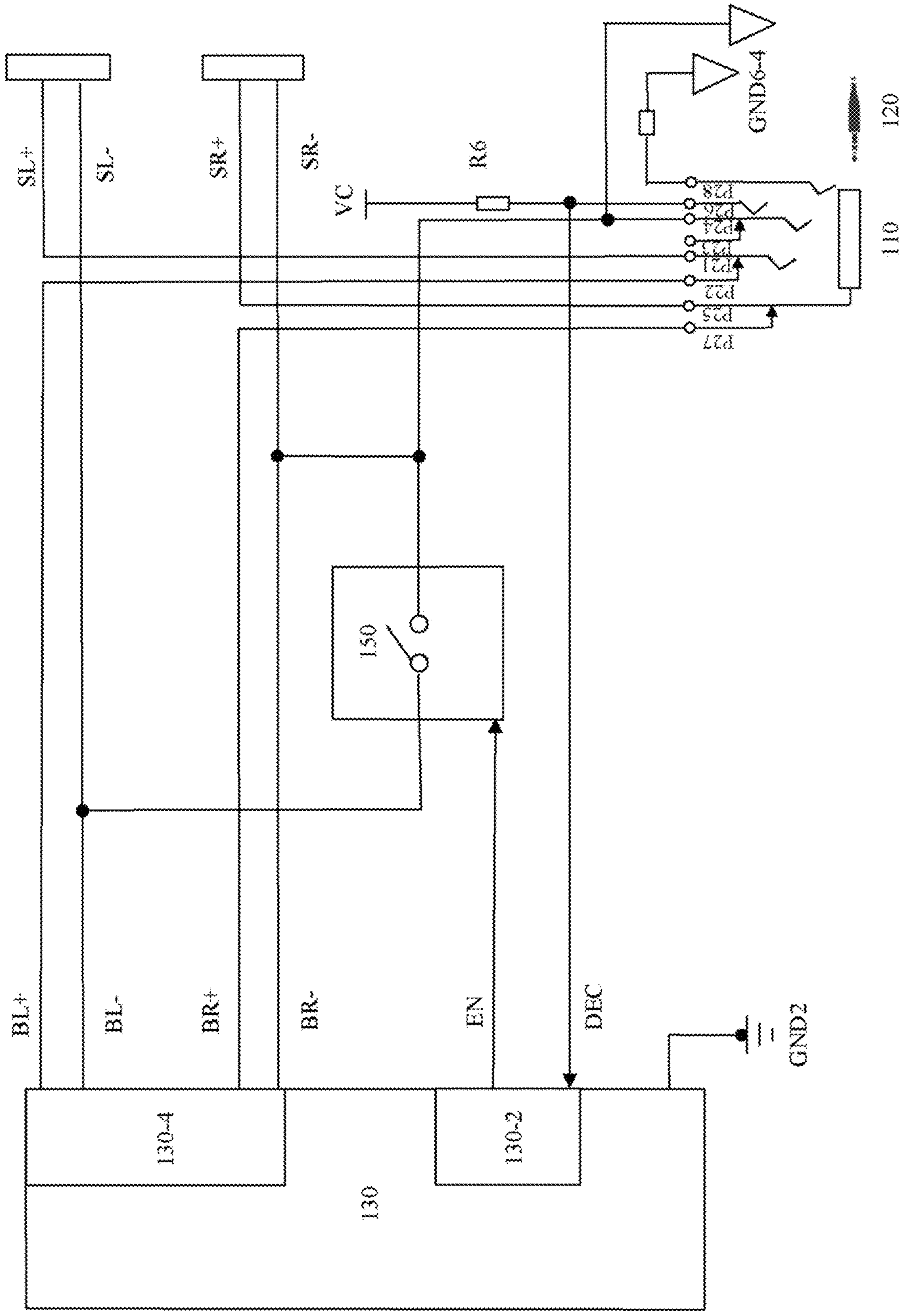
FIG. 3B illustrates a schematic principle diagram of a signal-switching circuit according to a sixth embodiment of the present disclosure.

Similar to the embodiment shown in FIG. 3A, FIG. 3B illustrates a schematic principle diagram of a signal-switching circuit according to a sixth embodiment of the present disclosure. In a case where the first electrical connector 110 and the second electrical connector 120 are not connected, the contact P27 and the contact P25 of the first electrical connector 110 can be connected, the contact P22 and the contact P21 thereof can be connected, the contact P23 and the contact P24 thereof can be connected, the contact P26 and the contact P28 thereof can be disconnected, and a high-level detection signal DEC can be output. The control unit 130-2 can determine that the switching enable signal EN is at a high level (here, enabling when the switching enable signal EN is at a low level is taken as an example, but not a limitation) based on the high-level detection signal DEC, so that the switching circuit 150 disconnects lines at both ends thereof. In a case where the first electrical connector 110 and the second electrical connector 120 are connected, the contact P27 and the contact P25 of the first electrical connector 110 can be disconnected, the contact P22 and the contact P21 thereof can be disconnected, the contact P23 and the contact P24 thereof can be disconnected, the contact P26 and the contact P28 thereof can be connected, and a low-level detection signal DEC can be output. The control unit 130-2 can determine that the switching enable signal EN is at a low level (here, enabling when the switching enable signal EN is at a low level is taken as an example, but not a limitation) based on the low-level detection signal DEC, so that the switching circuit 150 connects lines at both ends thereof.

At this time, the contact P26 can be connected to a grounding point GND6-4 through the second electrical connector 120. The grounding point GND2 and the grounding point GND6-4 may be different grounding points isolated from each other (i.e., GND2 is the grounding point of the signal processing circuit 130, and GND6-4 is the grounding point of the circuit connected to the second electrical connector 120).

It should be understood that the contacts of the first electrical connector 110 and the connection modes thereof shown in FIGS. 3A and 3B are merely illustrative examples. Based on similar principles, the contacts of the first electrical connector 110 may also be implemented in other ways. The first electronic device U2 and the second electronic device U4 in FIGS. 3A and 3B may be either a signal sending device or a signal receiving device.

Figure 4:
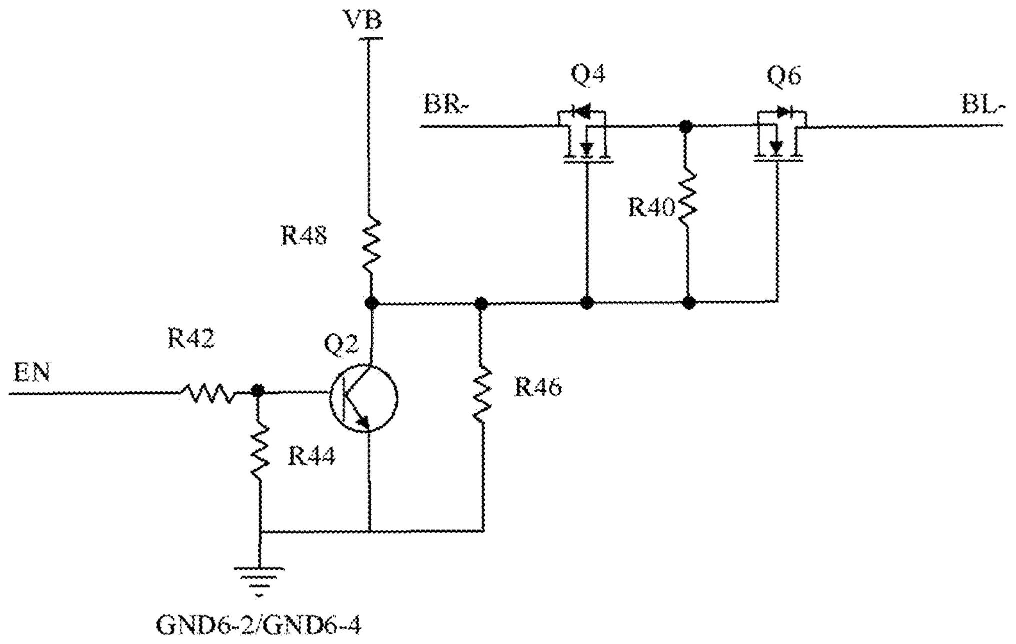
FIG. 4 illustrates a schematic principle diagram of a switching circuit according to an embodiment of the present disclosure.

According to an embodiment of the present disclosure, for the embodiment shown in FIG. 3A or FIG. 3B, the switching circuit 150 may have a circuit structure as shown in FIG. 4.

The switching circuit 150 may include a bipolar junction transistor Q2, a field effect transistor Q4, and a field effect transistor Q6. Among them, a base (i.e., a control electrode) of the bipolar junction transistor Q2 receives the switching enable signal EN through a resistor R42, an emitter of the bipolar junction transistor Q2 is connected with the grounding point GND6-2 or the grounding point GND6-4, and the collector of the bipolar junction transistor Q2 receives the high-level signal VB (e.g., the positive voltage signal VB can be 1.8 V) through a resistor R48. One end of the resistor R42 receives the switching enable signal EN, and the other end thereof is connected with a resistor R44. One end of the resistor R44 is connected with the resistor R42, and the other end thereof is connected with the grounding point GND6-2 or the grounding point GND6-4. A gate (i.e., a control electrode) of the field effect transistor Q4 and a gate (i.e., a control electrode) of the field effect transistor Q6 are respectively connected to the collector of the bipolar junction transistor Q2, a source of the field effect transistor Q4 is connected with a source of the field effect transistor Q6, a drain of the field effect transistor Q4 is connected to the negative signal terminal BR− of the signal processing circuit 130-4 (or the negative signal terminal SR− of the second electronic device U4), and a drain of the field effect transistor Q6 is connected to the negative signal terminal BL− of the signal processing circuit 130-4 (or the negative signal terminal SL− of the first electronic device U2). The resistor R40 may be connected in parallel between the gate (i.e., the control electrode) of the field effect transistor Q4 and the collector of the bipolar junction transistor Q2.

Based on the circuit structure above, in a case where it is detected that the second electrical connector 120 is connected with the first electrical connector 110, the control unit 130-2 outputs a low-level switching enable signal EN, so that the collector of the bipolar junction transistor Q2 outputs a high-level signal, the field effect transistor Q4 and the field effect transistor Q6 are turned on, and the negative signal terminal BR− of the signal processing circuit 130-4 (or the negative signal terminal SR− of the second electronic device U4) is connected with the negative signal terminal BL− of the signal processing circuit 130-4 (or the negative signal terminal SL− of the first electronic device U2).

In a case where it is detected that the second electrical connector 120 is not connected with the first electrical connector 110, the control unit 130-2 outputs a high-level switching enable signal EN, so that the collector of the bipolar junction transistor Q2 outputs a low-level signal, the field effect transistor Q4 and the field effect transistor Q6 are turned off, and the negative signal terminal BR− of the signal processing circuit 130-4 (or the negative signal terminal SR− of the second electronic device U4) is not connected with the negative signal terminal BL− of the signal processing circuit 130-4 (or the negative signal terminal SL− of the first electronic device U2).

It should be understood that in FIG. 4, both the field effect transistor Q4 and the field effect transistor Q6 are N-type field effect transistors for illustration purposes only and are not intended to be limiting. Optionally, the switching circuit 150 may alternatively be implemented based on a P-type field effect transistor, and its principle is similar to that in FIG. 4, which will not be described in detail again here.

Figure 5:
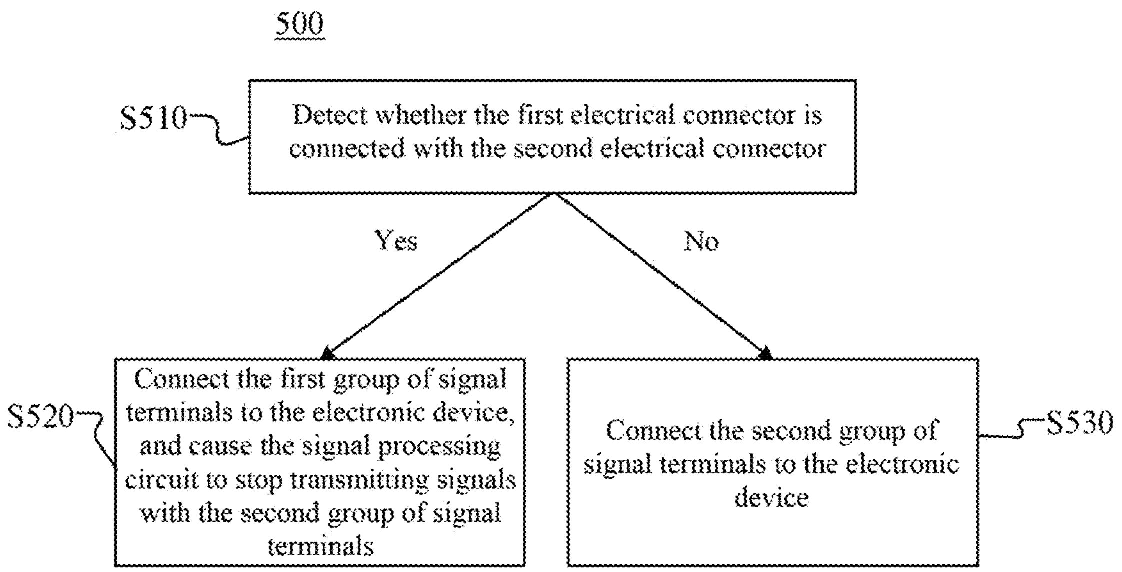
FIG. 5 illustrates a schematic flowchart of a signal-switching method according to an embodiment of the present disclosure.

FIG. 5 illustrates a schematic flowchart of a signal-switching method 500 according to an embodiment of the present disclosure.

In Step S510, it is detected whether a first electrical connector is connected with a second electrical connector.

In a case of detecting that the first electrical connector is connected with the second electrical connector, in step S520, a first group of signal terminals is connected to an electronic device and a signal processing circuit is caused to stop transmitting signals with a second group of signal terminals.

In a case of detecting that the first electrical connector is not connected with the second electrical connector, in step S530, the second group of signal terminals is connected to the electronic device.

For the signal-switching method 500 shown in FIG. 5, the second electrical connector is used for providing the first group of signal terminals, the signal processing circuit is used for providing the second group of signal terminals, the first group of signal terminals is different from the second group of signal terminals, and the second electrical connector and the signal processing circuit are connected to different grounding points isolated from each other.

The signal-switching method 500 can be implemented based on a signal-switching circuit. The signal-switching circuit includes: a first electrical connector used for connecting with a second electrical connector, where the second electrical connector is used for providing a first group of signal terminals; a signal processing circuit used for providing a second group of signal terminals, where the first group of signal terminals is different from the second group of signal terminals, and the second electrical connector and the signal processing circuit are connected to different grounding points isolated from each other; a connection detection circuit used for detecting whether the first electrical connector is connected with the second electrical connector; and a control unit used for causing the signal processing circuit to stop transmitting signals with the second group of signal terminals in a case of detecting that the first electrical connector is connected with the second electrical connector; where the signal-switching circuit is configured to: connect the first group of signal terminals to an electronic device in a case where the first electrical connector is connected with the second electrical connector; and connect the second group of signal terminals to the electronic device in a case where the first electrical connector is not connected with the second electrical connector.

According to an embodiment of the present disclosure, the electronic device can operate in a first mode when the first electrical connector is connected with the second electrical connector, and can operate in a second mode when the first electrical connector is not connected with the second electrical connector.

It should be noted that the electronic device in the present disclosure should be understood in a broad sense. For example, the electronic device in the present disclosure may be an integrated circuit, a part of a circuit, an electrical device, an industrial device, and the like.

For example, the first mode may be a wired working mode (e.g., a signal transmission working mode based on wired media such as cables, optical fibers, or network cables), and the second mode may be a wireless working mode (e.g., a radio wave working mode, a Bluetooth working mode, an infrared working mode, etc.).

According to an embodiment of the present disclosure, the electronic device includes at least two sub-devices; the control unit is further configured to output a switching enable signal in a case of detecting that the first electrical connector is connected with the second electrical connector; where the signal-switching circuit further includes: a switching circuit configured to connect some of the first group of the signal terminals to at least some of the at least two sub-devices, in response to the switching enable signal received from the control unit. That is, the signal-switching circuit can perform signal switching for one or more sub-devices. The signal-switching circuit can perform signal switching for all sub-devices in the electronic device, and can also selectively perform signal switching for some sub-devices in the electronic device (e.g., based on the type of the sub-device, based on user needs, etc.).

It should be understood that the control unit may be implemented based on at least one of a processor and a control circuit. The control unit may be an independent unit or a combination of multiple sub-units.

Optionally, signal switching can be performed for each of the at least two sub-devices by a separate signal-switching circuit, or signal switching can be performed for all the at least two sub-devices by a single signal-switching circuit, or the at least two sub-devices can be classified into multiple groups, so that signal switching can be performed by a switching circuit corresponding to each group respectively.

It should be understood that each of the at least two sub-devices can be either a signal sending device or a signal receiving device. The signal to be sent or received may be at least one of a digital signal or an analog signal. For example, the signal may be at least one of an audio signal, a text signal, an image signal, and a video signal.

According to an embodiment of the present disclosure, the second electrical connector can be used for switching the positive signals of the at least two sub-devices, and the switching circuit can be used for switching the negative signals of the at least two sub-devices; or the second electrical connector can be used for switching the negative signals of the at least two sub-devices, and the switching circuit can be used for switching the positive signals of the at least two sub-devices.

For example, the first group of signal terminals may include a first group of positive signal terminals and a first group of negative signal terminals, and the second group of signal terminals may include a second group of positive signal terminals and a second group of negative signal terminals. The first electrical connector is used for switching the positive signal terminals of the at least two sub-devices to the first group of positive signal terminals or the second group of positive signal terminals, and the switching circuit is used for switching the negative signal terminals of at least some of the at least two sub-devices to the first group of negative signal terminals or the second group of negative signal terminals; or the first electrical connector is used for switching the negative signal terminals of the at least two sub-devices to the first group of negative signal terminals or the second group of negative signal terminals, and the switching circuit is used for switching the positive signal terminals of at least some of the at least two sub-devices to the first group of positive signal terminals or the second group of positive signal terminals.

More specifically, in the case where the first electrical connector is used for switching the positive signal terminals of the at least two sub-devices to the first group of positive signal terminals or the second group of positive signal terminals, and the switching circuit is used for switching the negative signal terminals of at least some of the at least two sub-devices to the first group of negative signal terminals or the second group of negative signal terminals, connecting the first group of signal terminals to an electronic device includes: connecting the first group of positive signal terminals to the positive signal terminals of the at least two sub-devices respectively by using the contacts of the first electrical connector; and connecting the first group of negative signal terminals to the negative signal terminals of the at least two sub-devices respectively by using the switching circuit; or connecting the first negative signal terminal in the first group of negative signal terminals to the negative signal terminal of the first sub-device in the at least two sub-devices by using the contacts of the first electrical connector, and connecting other negative signal terminals than the first negative signal terminal in the first group of negative signal terminals to the negative signal terminals of other sub-devices than the first sub-device among the at least two sub-devices respectively by using the switching circuit. Connecting the second group of signal terminals to an electronic device includes: connecting the second group of positive signal terminals to the positive signal terminals of the at least two sub-devices respectively by using the contacts of the first electrical connector; and directly connecting the second group of negative signal terminals to the negative signal terminals of the at least two sub-devices respectively, or connecting the second group of negative signal terminals to the negative signal terminals of the at least two sub-devices respectively by using the switching circuit. Connecting the second group of signal terminals to an electronic device includes: connecting the second group of positive signal terminals to the positive signal terminals of the at least two sub-devices respectively by using the contacts of the first electrical connector; and directly connecting the second group of negative signal terminals to the negative signal terminals of the at least two sub-devices respectively, or connecting the second group of negative signal terminals to the negative signal terminals of the at least two sub-devices respectively by using the switching circuit.

For example, as shown in FIG. 2A or FIG. 2B, for the first group of signal terminals, the first group of positive signal terminals can be connected to the positive signal terminals of the first electronic device U2 and the first electronic device U4 respectively by using the contact P25 and the contact P21 of the first electrical connector 110 as shown in FIG. 2A or FIG. 2B; and the first group of negative signal terminals can be connected to the negative signal terminals of the first electronic device U2 and the second electronic device U4 respectively by using the switching circuit 140. For the second group of signal terminals, the second group of positive signal terminals can be connected to the positive signal terminals of the first electronic device U2 and the first electronic device U4 respectively by using the contacts P27, P25, P22, and P21 of the first electrical connector 110; and the second group of negative signal terminals can be directly connected to the negative signal terminals of the at least two sub-devices respectively.

As another example, as shown in FIG. 3A or FIG. 3B, for the first group of signal terminals, the first group of positive signal terminals can be connected to the positive signal terminals of the first electronic device U2 and the second electronic device U4 respectively by using the contact P25 and the contact P21 of the first electrical connector 110; the first negative signal terminal in the first group of negative signal terminals can be connected to the negative signal terminal of the second electronic device U4 by using the contact P24, as shown in FIG. 3A or FIG. 3B; and other negative signal terminals than the first negative signal terminal in the first group of negative signal terminals can be connected to the negative signal terminals of other sub-devices (i.e., the first electronic device U2 here) than the second electronic device U4 among the at least two sub-devices respectively by using the switching circuit 150. For the second group of signal terminals, the second group of positive signal terminals can be connected to the positive signal terminals of the first electronic device U2 and the first electronic device U4 respectively by using the contacts P27, P25, P22, and P21 of the first electrical connector 110; and the second group of negative signal terminals can be connected to the negative signal terminals of the at least two sub-devices respectively by using the switching circuit 150.

It should be understood that in the case where the first electrical connector is used for switching the negative signal terminals of the at least two sub-devices to the first group of negative signal terminals or the second group of negative signal terminals, and the switching circuit is used for switching the positive signal terminals of at least some of the at least two sub-devices to the first group of positive signal terminals or the second group of positive signal terminals, the connection of the signal terminals can also be achieved based on a principle similar to any one of FIGS. 2A, 2B, 3A, and 3B, which will not be detailed again here.

It should be understood that in order to reduce the size of the switching circuit and improve the stability of the circuit, the switching circuit can be implemented based on an integrated circuit (IC). In order to reduce the cost of the switching circuit, the switching circuit may also be implemented based on transistors.

According to an embodiment of the present disclosure, in a case where the switching circuit includes transistors, the switching circuit can turn on the transistors based on the switching enable signal to connect the first group of negative signal terminals to the negative signal terminals of the at least two sub-devices respectively, or connect other negative signal terminals than the first negative signal terminal in the first group of negative signal terminals to the negative signal terminals of other sub-devices than the first sub-device among the at least two sub-devices respectively.

For example, corresponding to the embodiment shown in FIG. 4, the transistors may include a first transistor (e.g., a bipolar junction transistor Q2 shown in FIG. 4), a second transistor (e.g., a field effect transistor Q4 shown in FIG. 4), and a third transistor (e.g., a field effect transistor Q6 shown in FIG. 4), where the control electrode of the first transistor receives the switching enable signal, the first electrode of the first transistor is grounded, the second electrode of the first transistor receives a high-level signal through a resistor, the control electrode of the second transistor and the control electrode of the third transistor are respectively connected to the second electrode of the first transistor, the second electrode of the second transistor is connected to the second electrode of the third transistor, the first electrode of the second transistor is connected to other negative signal terminals than the first negative signal terminal in the first group of negative signal terminals, and the first electrode of the third transistor is connected to the negative signal terminals of other sub-devices than the first sub-device among the at least two sub-devices. In a case of detecting that the first electrical connector is connected with the second electrical connector, the control unit outputs a low-level switching enable signal, so that the first electrode of the first transistor outputs a high-level signal, the second transistor and the third transistor are turned on to connect other negative signal terminals than the first negative signal terminal in the first group of negative signal terminals to the negative signal terminals of other sub-devices than the first sub-device among the at least two sub-devices respectively.

It should be understood that the field effect transistor can be either an N-type field effect transistor or a P-type field effect transistor.

Figure 6A:
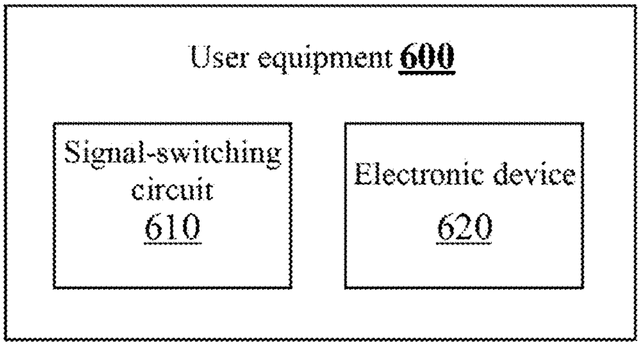
FIG. 6A illustrates a schematic composition diagram of a user equipment according to an embodiment of the present disclosure.

FIG. 6A illustrates a schematic composition diagram of a user equipment 600 according to an embodiment of the present disclosure.

According to an embodiment of the present disclosure, the user equipment 600 includes a signal-switching circuit 610 and an electronic device 620.

Figure 6B:
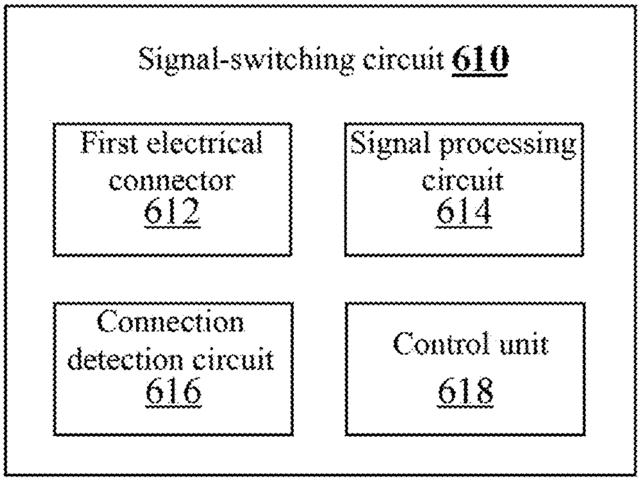
FIG. 6B illustrates a schematic composition diagram of a signal-switching circuit according to an embodiment of the present disclosure.

More specifically, FIG. 6B is a schematic composition diagram of a signal-switching circuit 610 according to an embodiment of the present disclosure.

The signal-switching circuit 610 may include: a first electrical connector 612 used for connecting with a second electrical connector, where the second electrical connector is used for providing a first group of signal terminals; a signal processing circuit 614 used for providing a second group of signal terminals, where the first group of signal terminals is different from the second group of signal terminals, and the second electrical connector and the signal processing circuit are connected to different grounding points isolated from each other; a connection detection circuit 616 used for detecting whether the first electrical connector is connected with the second electrical connector; and a control unit 618 used for causing the signal processing circuit to stop transmitting signals with the second group of signal terminals in a case of detecting that the first electrical connector is connected with the second electrical connector; where the signal-switching circuit 610 is configured to: connect the first group of signal terminals to an electronic device 620 in a case where the first electrical connector is connected with the second electrical connector; and connect the second group of signal terminals to the electronic device 620 in a case where the first electrical connector is not connected with the second electrical connector.

It should be noted that the signal-switching circuit 610 may not include the second electrical connector, and the second electrical connector may be independent of the user equipment 600. The signal-switching circuit 610 in FIG. 6 may have a structure and function similar to the signal-switching circuit for implementing the signal-switching method 500 described with respect to FIG. 5.

The electronic device 620 can operate in a first mode when the first electrical connector is connected with the second electrical connector, and can operate in a second mode when the first electrical connector is not connected with the second electrical connector. The first mode and the second mode may be different working modes.

For example, in the first mode, the electronic device 620 receives a signal from a first signal source, and in the second mode, the electronic device 620 receives a signal from a second signal source; or in the first mode, the electronic device 620 sends a signal to a first receiving device, and in the second mode, the electronic device 620 sends a signal to a second receiving device; or in the first mode, the electronic device 620 sends a signal to the first receiving device, and in the second mode, the electronic device 620 receives a signal from the first sending device; or in the first mode, the electronic device 620 receives a signal from the first sending device, and in the second mode, the electronic device 620 sends a signal to the first receiving device, and so on.

According to an embodiment of the present disclosure, the user equipment 600 may be a mobile phone, a computer, a head-mounted device (e.g., a headset, a head-mounted virtual reality device, etc.) For example, the user equipment 600 may be a headset, and the electronic device 620 may be an earpiece of the headset. In a case where the first electrical connector is connected with the second electrical connector, the earpiece of the headset may operate in a wired mode; and in a case where the first electrical connector is not connected with the second electrical connector, the earpiece of the headset may operate in a wireless mode, so as to enable the earpiece of the headset to select different audio signal sources (i.e., a signal source for the wired mode and a signal source for the wireless mode).

In summary, the present disclosure provides a signal-switching circuit, a signal-switching method, and a user equipment. The signal-switching circuit includes: a first electrical connector used for connecting with a second electrical connector, where the second electrical connector is used for providing a first group of signal terminals; a signal processing circuit used for providing a second group of signal terminals, where the first group of signal terminals is different from the second group of signal terminals, and the second electrical connector and the signal processing circuit are connected to different grounding points isolated from each other; a connection detection circuit used for detecting whether the first electrical connector is connected with the second electrical connector; and a control unit used for causing the signal processing circuit to stop transmitting signals with the second group of signal terminals in a case of detecting that the first electrical connector is connected with the second electrical connector; where the signal-switching circuit is configured to: connect the first group of signal terminals to an electronic device in a case where the first electrical connector is connected with the second electrical connector; and connect the second group of signal terminals to the electronic device in a case where the first electrical connector is not connected with the second electrical connector.

The signal-switching circuit of the present disclosure can switch signals input to or output from electronic devices conveniently and at low cost. Since the signal terminals corresponding to different signals in the signal-switching circuit of the present disclosure correspond to different grounding points, the electromagnetic interference to the electronic devices when working based on different signals can be effectively reduced.

The present disclosure uses specific words to describe the embodiments of the present disclosure. For example, "first/second embodiment", "an embodiment", and/or "some embodiments" means a feature, structure, or characteristic associated with at least one embodiment of the present disclosure. Accordingly, it should be emphasized and noted that "an embodiment" or "one embodiment" or "an alternative embodiment" referred to two or more times in different places in this specification does not necessarily refer to the same embodiment. In addition, some features, structures, or characteristics of one or more embodiments of the present disclosure may be combined as appropriate.

It should be noted that, in this specification, the terms "comprises", "includes", or any other variations thereof are intended to cover non-exclusive inclusion, so that a process, method, article, or device comprising a series of elements comprises not only those elements, but also other elements not explicitly listed, or also comprises elements inherent to such process, method, article, or device. Without more constraints, an element defined by the phrase "comprising a . . . " does not exclude the presence of other identical elements in the process, method, article, or device comprising the element.

Furthermore, the series of processes described above include not only processes executed in time series in the order described here but also processes executed in parallel or separately, not in time series.

Through the foregoing description of the embodiments, those skilled in the art can clearly understand that the present disclosure may be implemented by means of software plus a necessary hardware platform, and of course may also be implemented entirely by hardware. Based on this understanding, all or part of the contribution of the technical solution of the present disclosure to the background art can be embodied in the form of a software product. The computer software product can be stored in a storage medium, such as ROM (read-only memory)/RAM (random access memory), a disk, an optical disc, etc., including a number of instructions for enabling a computer device (which may be a personal computer, a server, or a network device, etc.) to execute the signal-switching circuit described in various embodiments or some parts of the embodiments of the present disclosure.

Unless otherwise defined, all terms used herein, including technical and scientific terms, have the same meaning as commonly understood by those of ordinary skill in the art to which the present disclosure belongs. It should also be understood that terms such as those defined in common dictionaries should be construed as having a meaning consistent with their meaning in the context of the related art and should not be construed with idealized or extremely formalized meanings unless expressly defined as such herein.

The foregoing is a description of the present disclosure and should not be considered a limitation thereof. Although several exemplary embodiments of the present disclosure are described, it will be readily understood by those skilled in the art that many modifications can be made to the exemplary embodiments without departing from the novel teachings and advantages of the present disclosure. Accordingly, all such modifications are intended to be encompassed within the scope of the present disclosure as defined by the claims. It should be understood that the foregoing is a description of the present disclosure and should not be considered to be limited to the particular embodiments as disclosed, and that modifications to the disclosed embodiments, as well as other embodiments, are intended to be included within the scope of the appended claims. The present disclosure is defined by the claims and equivalents thereof.

The invention claimed is:

1. A signal-switching circuit comprising:

a first electrical connector used for connecting with a second electrical connector, wherein the second electrical connector is used for providing a first group of signal terminals;

a signal processing circuit used for providing a second group of signal terminals, wherein the first group of signal terminals is different from the second group of signal terminals, and the second electrical connector and the signal processing circuit are connected to different grounding points isolated from each other;

a connection detection circuit used for detecting whether the first electrical connector is connected with the second electrical connector; and a control unit used for causing the signal processing circuit to stop transmitting signals with the second group of signal terminals in a case of detecting that the first electrical connector is connected with the second electrical connector;

wherein the signal-switching circuit is configured to connect the first group of signal terminals to an electronic device in a case where the first electrical connector is connected with the second electrical connector; and connect the second group of signal terminals to the electronic device in a case where the first electrical connector is not connected with the second electrical connector.

2. The signal-switching circuit according to claim 1, wherein the electronic device operates in a first mode when the first electrical connector is connected with the second electrical connector, and operates in a second mode when the first electrical connector is not connected with the second electrical connector.

3. The signal-switching circuit according to claim 2, wherein the first mode is a wired working mode, and the second mode is a wireless working mode, the wireless working mode comprises at least one of a radio wave working mode, a Bluetooth working mode, and an infrared working mode.

4. The signal-switching circuit according to claim 1, wherein the electronic device comprises at least two sub-devices; the control unit is further configured to output a switching enable signal in a case of detecting that the first electrical connector is connected with the second electrical connector;

wherein the signal-switching circuit further comprises:

a switching circuit configured to connect some of the first group of the signal terminals to at least some of the at least two sub-devices, in response to the switching enable signal received from the control unit.

5. The signal-switching circuit of claim 4, wherein the first group of signal terminals comprises a first group of positive signal terminals and a first group of negative signal terminals, the second group of signal terminals comprises a second group of positive signal terminals and a second group of negative signal terminals;

wherein the first electrical connector is used for switching the positive signal terminals of the at least two sub-devices to the first group of positive signal terminals or the second group of positive signal terminals, and the switching circuit is used for switching the negative signal terminals of at least some of the at least two sub-devices to the first group of negative signal terminals or the second group of negative signal terminals; or the first electrical connector is used for switching the negative signal terminals of the at least two sub-devices to the first group of negative signal terminals or the second group of negative signal terminals, and the switching circuit is used for switching the positive signal terminals of at least some of the at least two sub-devices to the first group of positive signal terminals or the second group of positive signal terminals.

6. The signal-switching circuit according to claim 5, wherein in the case where the first electrical connector is used for switching the positive signal terminals of the at least two sub-devices to the first group of positive signal terminals or the second group of positive signal terminals, and the switching circuit is used for switching the negative signal terminals of at least some of the at least two sub-devices to the first group of negative signal terminals or the second group of negative signal terminals, connecting the first group of signal terminals to an electronic device comprises:

connecting the first group of positive signal terminals to the positive signal terminals of the at least two sub-devices respectively by using the contacts of the first electrical connector; and connecting the first group of negative signal terminals to the negative signal terminals of the at least two sub-devices respectively by using the switching circuit; or connecting the first negative signal terminal in the first group of negative signal terminals to the negative signal terminal of the first sub-device in the at least two sub-devices by using the contacts of the first electrical connector, and connecting other negative signal terminals than the first negative signal terminal in the first group of negative signal terminals to the negative signal terminals of other sub-devices than the first sub-device among the at least two sub-devices respectively by using the switching circuit;

connecting the second group of signal terminals to an electronic device comprises:

connecting the second group of positive signal terminals to the positive signal terminals of the at least two sub-devices respectively by using the contacts of the first electrical connector; and directly connecting the second group of negative signal terminals to the negative signal terminals of the at least two sub-devices respectively, or connecting the second group of negative signal terminals to the negative signal terminals of the at least two sub-devices respectively by using the switching circuit.

7. The signal-switching circuit according to claim 6, wherein the switching circuit comprises transistors, wherein the switching circuit turns on the transistors based on the switching enable signal to connect the first group of negative signal terminals to the negative signal terminals of the at least two sub-devices respectively, or connect other negative signal terminals than the first negative signal terminal in the first group of negative signal terminals to the negative signal terminals of other sub-devices than the first sub-device among the at least two sub-devices respectively.

8. The signal-switching circuit according to claim 7, wherein the transistors comprise a first transistor, a second transistor, and a third transistor, wherein a control electrode of the first transistor receives the switching enable signal, a first electrode of the first transistor is grounded, a second electrode of the first transistor receives a high-level signal via a resistor, a control electrode of the second transistor and a control electrode of the third transistor are respectively connected to the second electrode of the first transistor, a second electrode of the second transistor is connected to a second electrode of the third transistor, a first electrode of the second transistor is connected to other negative signal terminals than the first negative signal terminal in the first group of negative signal terminals, and a first electrode of the third transistor is connected to the negative signal terminals of other sub-devices than the first sub-device among the at least two sub-devices, wherein in a case of detecting that the first electrical connector is connected with the second electrical connector, the control unit outputs a low-level switching enable signal, so that the first electrode of the first transistor outputs a high-level signal, the second transistor and the third transistor are turned on to connect other negative signal terminals than the first negative signal terminal in the first group of negative signal terminals to the negative signal terminals of other sub-devices than the first sub-device among the at least two sub-devices respectively.

9. A signal-switching method, comprising:

in a case of detecting that a first electrical connector is connected with a second electrical connector, connecting a first group of signal terminals to an electronic device and causing a signal processing circuit to stop transmitting signals with a second group of signal terminals, wherein the second electrical connector is used for providing the first group of signal terminals, and the signal processing circuit is used for providing the second group of signal terminals; and in a case of detecting that the first electrical connector is not connected with the second electrical connector, connecting the second group of signal terminals to the electronic device, wherein the first group of signal terminals are different from the second group of signal terminals, and the second electrical connector and the signal processing circuit are connected to different grounding points isolated from each other.

10. A user equipment comprising a signal-switching circuit and an electronic device, wherein, the signal-switching circuit comprises:

a first electrical connector used for connecting with a second electrical connector, wherein the second electrical connector is used for providing a first group of signal terminals;

a signal processing circuit used for providing a second group of signal terminals, wherein the first group of signal terminals is different from the second group of signal terminals, and the second electrical connector and the signal processing circuit are connected to different grounding points isolated from each other;

a connection detection circuit used for detecting whether the first electrical connector is connected with the second electrical connector; and a control unit used for causing the signal processing circuit to stop transmitting signals with the second group of signal terminals in a case of detecting that the first electrical connector is connected with the second electrical connector;

wherein the signal-switching circuit is configured to connect the first group of signal terminals to an electronic device in a case where the first electrical connector is connected with the second electrical connector; and connect the second group of signal terminals to the electronic device in a case where the first electrical connector is not connected with the second electrical connector.

* * * * *